(12) United States Patent
Muramatsu

(10) Patent No.: US 7,699,624 B2
(45) Date of Patent: Apr. 20, 2010

(54) DIAL MODULE AND PROCESS FOR MANUFACTURING THE SAME, LED DISPLAY ELEMENT, DISPLAY MODULE, MOVEMENT MODULE, CONNECTOR MODULE AND METER EMPLOYING THE SAME

(75) Inventor: Masahiro Muramatsu, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/219,993

(22) Filed: Jul. 31, 2008

(65) Prior Publication Data

US 2008/0298027 A1 Dec. 4, 2008

Related U.S. Application Data

(62) Division of application No. 10/528,448, filed as application No. PCT/JP03/12013 on Sep. 19, 2003, now abandoned.

(30) Foreign Application Priority Data

Sep. 20, 2002 (JP) .............................. 2002-275896

(51) Int. Cl.
*H01R 12/00* (2006.01)
(52) U.S. Cl. .................... 439/76.2; 439/541.5
(58) Field of Classification Search ............... 439/76.1, 439/76.2, 34, 35, 630, 541.5, 620.06, 620.12–620.17, 439/620.31, 620.32
See application file for complete search history.

(56) References Cited

U.S. PATENT DOCUMENTS

| 3,475,657 | A | * | 10/1969 | Knowles ..................... 361/787 |
| 4,775,964 | A | | 10/1988 | Alessio et al. ................. 368/67 |
| 4,963,098 | A | * | 10/1990 | Myer et al. ................. 439/76.1 |
| 5,085,601 | A | * | 2/1992 | Buchter et al. ............... 439/660 |
| 5,265,071 | A | | 11/1993 | Thorgersen et al. ........... 368/67 |
| 5,322,447 | A | * | 6/1994 | Okada ......................... 439/79 |
| 5,399,105 | A | * | 3/1995 | Kaufman et al. ............. 439/609 |
| 5,406,303 | A | | 4/1995 | Salmon et al. ................. 345/75 |
| 5,947,753 | A | * | 9/1999 | Chapman et al. .............. 439/79 |
| 6,070,549 | A | | 6/2000 | Iuchi et al. ................... 116/287 |
| 6,183,099 | B1 | | 2/2001 | Garay et al. .................. 362/26 |
| 6,299,321 | B1 | | 10/2001 | Fuwausa ....................... 362/29 |
| 6,332,783 | B1 | * | 12/2001 | Ukiya et al. ............... 439/76.1 |
| 6,333,697 | B1 | | 12/2001 | Kumazawa et al. ....... 340/815.4 |
| 6,599,135 | B2 | * | 7/2003 | Yamane ..................... 439/76.2 |
| 6,600,865 | B2 | * | 7/2003 | Hwang ....................... 385/134 |

(Continued)

FOREIGN PATENT DOCUMENTS

JP 53-10576 9/1978

(Continued)

*Primary Examiner*—T C Patel
*Assistant Examiner*—Harshad C Patel
(74) *Attorney, Agent, or Firm*—Kratz, Quintos & Hanson, LLP

(57) ABSTRACT

The dial module includes: a sheet-shaped dial having a design part on a surface of the dial; a sheet-shaped light source fixed to a back surface of the dial for illuminating the design part; and a flexible printed circuit fixed to a back surface of the light source. The dial module thus constructed enables to reduce the number of components, to facilitate assembly of a meter which employs the dial module therein, to improve the productivity, and to reduce the cost.

4 Claims, 11 Drawing Sheets

U.S. PATENT DOCUMENTS

| | | | |
|---|---|---|---|
| 6,607,405 B2 * | 8/2003 | Nishimura | 439/630 |
| 6,621,471 B1 | 9/2003 | Ozaki et al. | 345/4 |
| 6,623,305 B2 * | 9/2003 | Chun-Lung | 439/630 |
| 6,857,907 B1 * | 2/2005 | Hung et al. | 439/630 |
| 7,070,446 B2 * | 7/2006 | Henry et al. | 439/541.5 |
| 2001/0039129 A1 * | 11/2001 | Nishimura | 439/74 |
| 2002/0168900 A1 * | 11/2002 | Chen | 439/630 |
| 2004/0235354 A1 * | 11/2004 | Takahashi | 439/630 |
| 2005/0254257 A1 * | 11/2005 | Long | 362/581 |
| 2005/0255745 A1 * | 11/2005 | Walker et al. | 439/541.5 |
| 2006/0086792 A1 * | 4/2006 | Chen et al. | 235/441 |
| 2008/0032526 A1 * | 2/2008 | Takahashi | 439/81 |

FOREIGN PATENT DOCUMENTS

| | | |
|---|---|---|
| JP | 62-172220 | 7/1987 |
| JP | 01-205480 | 8/1989 |
| JP | 05-28737 | 4/1993 |
| JP | 05-38927 | 5/1993 |
| JP | 08-201102 | 8/1996 |
| JP | 08-230516 | 9/1996 |
| JP | 09-92415 | 4/1997 |
| JP | 09-159493 | 6/1997 |
| JP | 10-185627 | 7/1998 |
| JP | 10-241782 | 9/1998 |
| JP | 11-6747 | 1/1999 |

* cited by examiner

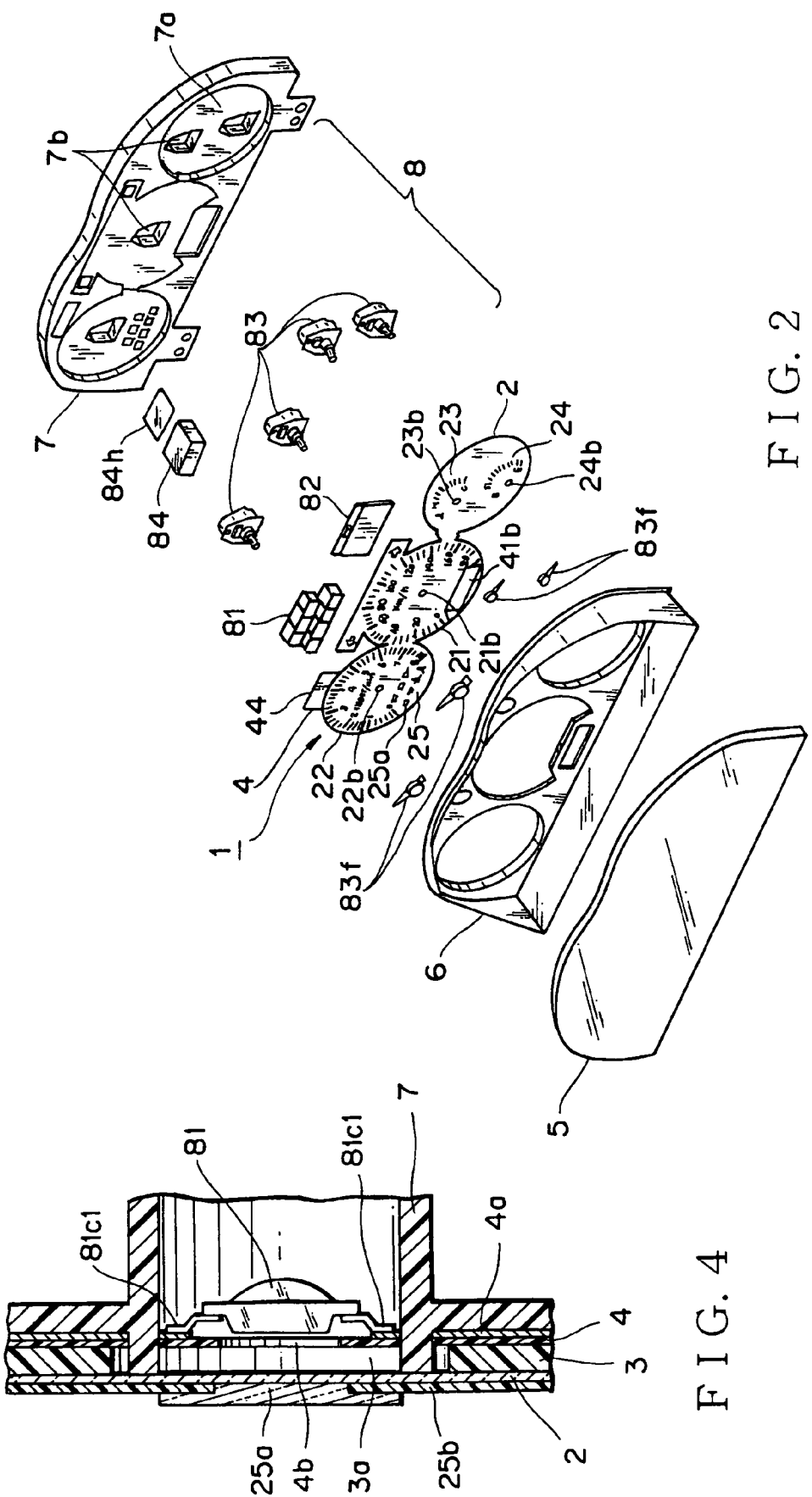

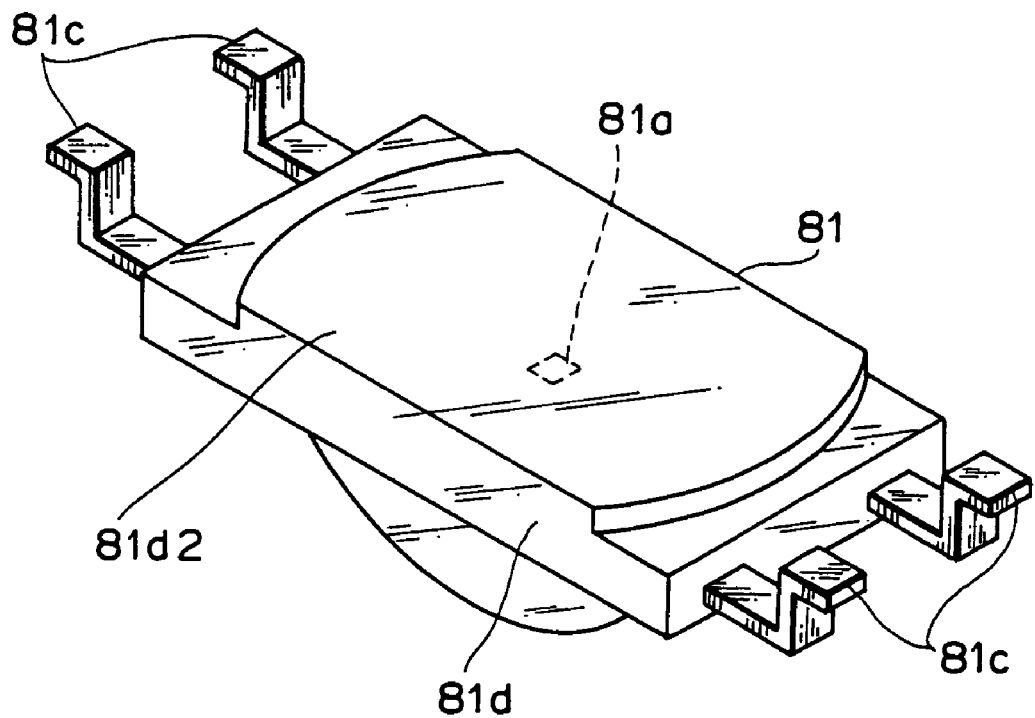
F I G. 3A
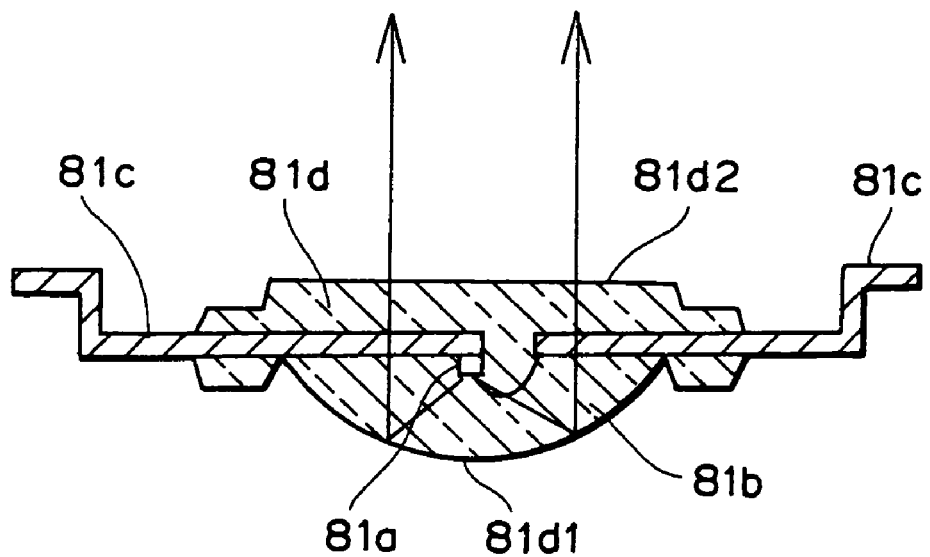
F I G. 3B

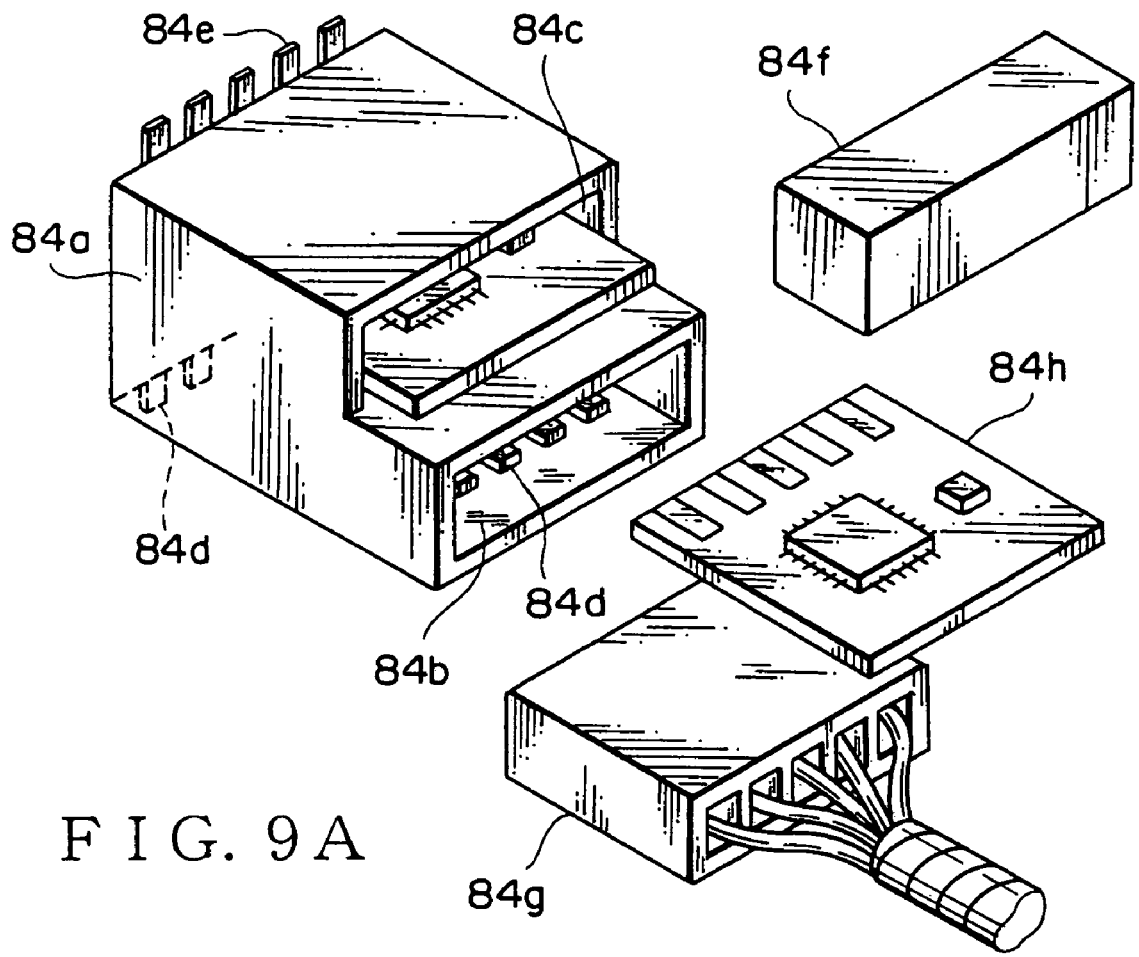
F I G. 9A
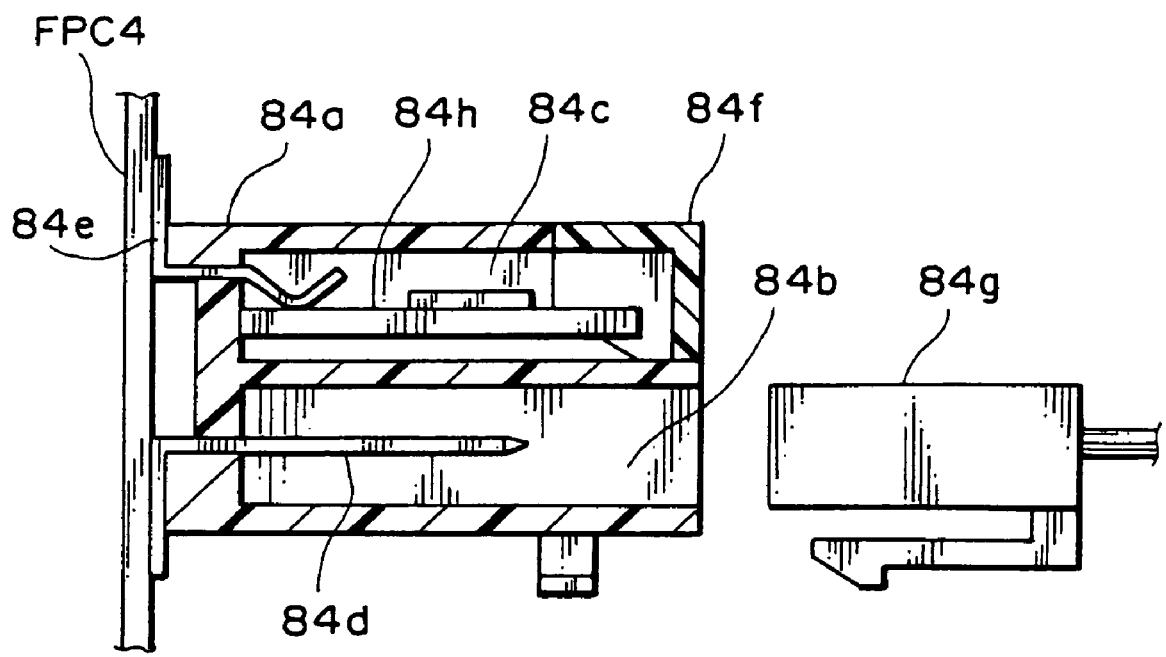
F I G. 9B

DIAL MODULE AND PROCESS FOR MANUFACTURING THE SAME, LED DISPLAY ELEMENT, DISPLAY MODULE, MOVEMENT MODULE, CONNECTOR MODULE AND METER EMPLOYING THE SAME

RELATED APPLICATIONS

This application is a Division of application Ser. No. 10/528,448, filed Mar. 18, 2005 now abandoned, which application is a 371 of PCT/JP03/12013, filed Sep. 19, 2003, which application claims priority of Japanese Application No. 2002-275896, filed Sep. 20, 2002, the contents of which are incorporated herein by reference.

FIELD OF THE INVENTION

The present invention relates to a dial module and process for manufacturing the dial module, LED display element, display module, movement module, connector module and meter employing the same.

BACKGROUND OF THE INVENTION

Since many electric instruments are arranged around an instrument panel of a motor vehicle, and control circuit units, meters, indicator lumps and switches for controlling and monitoring these electric instruments are concentrated there, therefore the number of electric wires for constructing an instrument wiring harness increases greatly, its wiring form becomes complicated due to the increasing number of the electric wires and increasing weight thereof, resulting in that the mounting of the electric wires and connector-joining work between the harness and the electric instruments require a great deal of labor and time, making the maintenance difficult to do.

In order to solve these problems, the applicant has so far proposed measures for simplifying the wiring form of a wiring harness by making meters and relevant electric instruments be a meter module around an instrument panel.

FIG. 13 is an exploded perspective view illustrating an example of a conventional meter for use in a motor vehicle proposed by the applicant. As shown in FIG. 13, the meter for use in a motor vehicle includes a front glass 5, plate 6, dial (i.e., dial plate) 2, casing 12, board assembly 13, and stepper motor 83b as a movement. A bracket, lamp casing and housing are incorporated with the casing 12. The dial 2 is provided with meters such as a speed meter 21, tachometer 22, thermometer 23 and fuel meter 24, and meters consisting of various indicators such as a warning display 25 on a surface of the dial 2.

The speed meter 21 includes meter design part 21a consisting of the scale, characters and indices, and a through hole 21b formed at the center for attaching a pointer 83f on a front surface of the dial 2 by guiding a rotation shaft of the stepper motor 83b therethrough. Similarly, the tachometer 22 includes a meter design part 22a and through hole 22b, the thermometer 23 includes a meter design part 23a and through hole 23b, and the fuel meter 24 includes a meter design part 24a and through hole 24b.

A translucent paint such as a white paint is printed on each of the meter design parts 21a, 22a, 23a, 24a and 25a of the speed meter 21, tachometer 22, thermometer 23, fuel meter 24 and warning display 25, respectively. A light-blocking paint such as a black paint is printed on a portion except each design part. Each design part disperses the light from a light source (not shown in the figure) attached to the board assembly 13 by means of a lamp casing of the casing 12 so as to light up from the back.

For example, the meter design part 25a of the warning display 25 is illuminated by a shell-type light-emitting diode (LED) display element (not shown in the figure) mounted on the board assembly 13 as a light source when a warning is given.

On the board assembly 13, there are mounted an IC as a drive element for driving a LED display element for the warning display 25, IC as a drive element for driving a LCD (liquid crystal display) as an assistant display element for displaying such as a trip meter, an IC as a drive element for driving a stepper motor 83b, and other electronic instruments for carrying out various functions of meters for a vehicle.

Further, as shown in FIG. 14, the stepper motor 83b includes an upper casing 83b-1 and lower casing 83b-2 made of synthetic resin or the like. A pair of engaging holes 83b-1a of the upper casing 83b-1 engages with an engaging projection 83b-2a formed on an outer wall of the lower casing 83b-2, thereby fixing the upper and lower casings 83b-1, 83b-2 to each other. A rotation shaft 83b-3 for attaching a needle (indication needle) 83f penetrates through to protrude from an upper surface of the upper casing 83b-1. A side wall of the upper casing 83b-1 is provided with an arm-shaped hook 83b-1c in the inverse direction to the rotation shaft 83b-3.

As for the meter for a vehicle, a bracket, lamp casing and housing are incorporated with the casing 12, and the board assembly 13 is assembled into a single board, thereby having advantages of easy assembling and simple structure.

FIGS. 15 and 16 show a perspective view and cross sectional view taken along B-B line illustrating another example of a conventional meter for a vehicle. As shown in FIGS. 15 and 16, the meter for a vehicle includes: a display board 101 having a circuit pattern (not shown in the figure) capable of electric conduction between a front surface 101a and back surface 101b; and a display devices such as a speed meter 102, tachometer 105, fuel meter 108 and thermometer 111, each mounted on the front surface 101a of the display board 101.

The speed meter 102 includes: a stepper motor 103 as a movement fixed to the display board 101; and a needle 104 attached to an output shaft 103a of the stepper motor 103 that functions as internal equipment for driving the needle 104 in response to measured quantity data of a speed of the vehicle.

The tachometer 105 includes a stepper motor 106 and a needle 107 attached to an output shaft 106a of the stepper motor 106 that functions as internal equipment for driving the needle 107 in response to measured quantity data of number of revolutions of an engine.

The fuel meter 108 includes a stepper motor 109 and a needle 110 attached to an output shaft 109a of the stepper motor 109 that functions as internal equipment for driving the needle 110 in response to measured quantity data of the amount of fuel.

The thermometer 111 includes a stepper motor 112 and a needle 113 attached to an output shaft 112a of the stepper motor 112 that functions as internal equipment for driving the needle 113 in response to measured quantity data of temperature in a vehicle.

Between each stepper motor and the corresponding needle, there is arranged a dial, which is provided with a scale and indices such as numbers, characters and marks on a surface on the dial (not shown in the figure).

The meter for a vehicle includes: an infrared light-receiving element 114 and an IC (Integrated Circuit) 115 for a stepper motor driver and infrared communication, each of which is mounted on the back surface 101b of the display board 101 and electrically connected to the speed meter 102 mounted on the front surface 101a; an infrared light-receiving element 116 and an IC (Integrated Circuit) 117 for a stepper motor driver and infrared communication, each of which is electrically connected to the tachometer 105 mounted on the front surface 101a; an infrared light-receiving element 118 and an IC (Integrated Circuit) 119 for a stepper motor driver and infrared communication, each of which is electrically connected to the fuel meter 108 mounted on the front surface 101a; and an infrared light-receiving element 120 and an IC (Integrated Circuit) 121 for a stepper motor driver and infrared communication, each of which is electrically connected to the thermometer 111 mounted on the front surface 101a.

Further, the meter for a vehicle includes a control module 122 attached to the back surface 101b of the display board 101. The control module 122 is provided with an IC 124 (including an I/F (interface) circuit IC, microcomputer IC and infrared communication IC) and an infrared light-emitting element 125 on a board provided with a circuit pattern (not shown in the figure).

The control module 122 is detachably attached to the display board 101 with two fittings 123. The fitting 123 has a groove 123a for fitting the control module board 122 thereinto at one end thereof and four claw-shaped engaging parts 123b for resiliently engaging with corresponding engaging holes 101c of the display board 101 at the opposite end thereof.

Each measured quantity of the vehicle speed, number of revolutions of the engine, amount of the fuel and temperature in the vehicle detected by the respective sensors (not shown in the figure) are inputted into the control module 122 in a form of, for example, serial data. Then, each measured quantity is processed on the basis of the inputted data and then, each measured quantity as the quantity data labeled with a specific identification code is transmitted from the infrared light-emitting element 125 as an infrared signal.

The infrared signal transmitted from the infrared light-emitting element 125 is received by the respective infrared light-receiving elements 114, 116, 118 and 120 and supplied to the respective IC 115, 117, 119 and 121 for a stepper motor driver and infrared communication. Each of the IC 115, 117, 119 and 121 for a stepper motor driver and infrared communication selectively supplies the corresponding measured quantity data of the vehicle speed, number of revolution of the engine, amount of the fuel and temperature in the vehicle to the corresponding meters, that is, the speed meter 102, tachometer 105, fuel meter 108 and thermometer 111 according to the corresponding specific identification code.

Thus, a control section, which is a basic control part for controlling the respective meters, each indicating the measured quantity as to a state of the vehicle, is made a module as the control module 122, thereby enabling to be commonly used for any meter. The output from the control module 122 is made to be an infrared communication output. On the display board 101, the infrared light-receiving element and the corresponding IC for a stepper motor driver and infrared communication are mounted corresponding to each meter.

Each of the IC 115, 117, 119 and 121 for a stepper motor driver and infrared communication is connected to the corresponding stepper motor 103, 106, 109 and 112, each of which constitutes the corresponding meter device such as the speed meter 102, tachometer 105, fuel meter 108 and thermometer 111. Therefore, each stepper motor can be operable with the infrared signal from the control module 122.

Thus, as for the meter for a vehicle shown in FIGS. 15 and 16, a structure of an integrated board is illustrated, on which integrated board each stepper motor 103, 106, 109 and 112 as the movement and each IC 115, 117, 119 and 121 for a stepper motor driver and infrared communication are mounted.

However, as for the meter for a vehicle shown in FIGS. 13 and 14, since each of the casing 12 and board assembly 13 is molded to have a predetermined shape with resin or the like as a separate part separated from the dial 2, therefore if the arrangement of the meter varies depending on a type of the vehicle, it is necessary to make separately the dial, casing and board assembly by changing their shapes depending on a type of the vehicle so as to fit to the arrangement of the meter, causing a problem that such a meter for a vehicle cannot be commonly used for various types of the vehicle. Moreover, since a meter control circuit and so on must be designed and manufactured separately depending on a type of the vehicle, therefore electronic components for constituting the meter control circuit, which components vary depending on a type of the vehicle, must be mounted on the board assembly 13. Once the board assembly 13 is determined, there is a problem that it is difficult to change a specification of the meter control circuit afterward.

Further, the integrated board for the meter for a vehicle shown in FIGS. 13-16 has restriction for designing due to a limited wiring space. Further, a board having high mounting density must be designed separately depending on a combination or layout of the respective meters, causing a necessity of a large man-hour for designing. Further, when the board is completed, there is a problem that an evaluation of noise and so on must be carried out each time.

Further, the integrated board described above needs a mounting space for mounting a plurality of drive elements for carrying out the respective functions of the meter for a vehicle. Further, when the integrated board is designed as a board which can be used in common for a plurality of types of vehicle, there is a problem that a useless mounting space for a drive element for an unnecessary function occurs depending on a type of the vehicle.

It is certainly possible to mount a microcomputer having a CPU for carrying out the functions of a plurality of drive elements on the integrated board. However, in such a case, depending on a type of the vehicle, there is a problem that a driver element, which is not used, exists in the CPU.

It is therefore an objective of the present invention to solve the above problems and to provide a dial module, process for manufacturing the dial module, and a meter employing the dial module, which dial module enables further modularity (further module structure) and common use for a plurality types of vehicle.

It is another objective of the present invention to solve the above problems and to provide a LED display element having a novel constitution suitable for use of the dial module and a meter employing the LED display element.

It is a further objective of the present invention to solve the above problems and to provide a display module and a meter employing the display module, which display module enables further modularity and common use for a plurality types of vehicle.

It is a further objective of the present invention to solve the above problems and to provide a movement module and a meter employing the movement module, which movement module enables further modularity and common use for a plurality types of vehicle.

It is a further objective of the present invention to solve the above problems and to provide a connector module and a meter employing the connector module, which connector module enables further modularity and common use for a plurality types of vehicle.

DISCLOSURE OF THE INVENTION

In order to attain the above objective, a dial module defined in claim 1 is a dial module including a sheet-shaped dial having a design part on a front surface of the dial; a sheet-shaped light source fixed to a back surface of the dial for illuminating the design part; and a flexible printed circuit fixed to a back surface of the light source.

In order to attain the above objective, a dial module defined in claim 2 is, in the invention defined in claim 1, characterized in that the dial, light source and flexible printed circuit are formed in substantially the same shape.

In order to attain the above objective, a dial module defined in claim 3 is a dial module including a dial having a design part; a sheet-shaped light source for illuminating the design part; and a flexible printed circuit fixed to a back surface of the light source, wherein the dial is formed on a front surface of the light source.

In order to attain the above objective, a dial module defined in claim 4 is, in the invention defined in claim 3, characterized in that the light source and flexible printed circuit are formed in substantially the same shape.

In order to attain the above objective, a dial module defined in claim 5 is a dial module including a sheet-shaped dial having a design part on a front surface of the dial; and a sheet-shaped light source fixed to a back surface of the dial for illuminating the design part, wherein the light source is provided with a flexible printed circuit on a back surface of the light source.

In order to attain the above objective, a dial module defined in claim 6 is, in the invention defined in claim 5, characterized in that the dial and light source are formed in substantially the same shape.

In order to attain the above objective, a dial module defined in claim 7 is a dial module including a sheet-shaped light source, wherein a dial having a design part is formed on a front surface of the light source while a flexible printed circuit is formed on a back surface of the light source.

In order to attain the above objective, a dial module defined in claim 8 is, in the invention defined in any one of claims 1-7, characterized in that it further includes a connecting terminal part for attaching an additional component thereto.

In order to attain the above objective, a dial module defined in claim 9 is, in the invention defined in any one of claims 1-8, characterized in that the light source is a sheet-shaped electroluminescent light source.

In order to attain the above objective, a process for manufacturing a dial module defined in claim 10 is a process for manufacturing a dial module including: a first step in which a flexible printed circuit is put and sealed on a back surface of a sheet-shaped light source with an adhesive; and a second step in which a dial having a design part is printed on a front surface of the light source.

In order to attain the above objective, a process for manufacturing a dial module defined in claim 11 is, in the invention defined in claim 10, characterized in that the light source is formed by providing a transparent electrically conductive film with a luminous layer, insulating layer and back surface electrode, and the flexible printed circuit is formed by providing a copper foil film with a circuit with etching followed by an insulation processing.

In order to attain the above objective, a process for manufacturing a dial module defined in claim 12 is a process for manufacturing a dial module including a first step in which a circuit is formed on a back surface of a sheet-shaped light source by printing an electrically conductive material on the back surface; and a second step in which a dial having a design part is printed on a front surface of the light source.

In order to attain the above objective, a process for manufacturing a dial module defined in claim 13 is, in the invention defined in claim 12, characterized in that it further includes a third step in which an insulation processing is applied on a part where the circuit is formed.

In order to attain the above objective, a process for manufacturing a dial module defined in claim 14 is, in the invention defined in any one of claims 10-13, characterized in that the light source is a sheet-shaped electroluminescent light source.

In order to attain the above objective, a meter defined in claim 15 is a meter including the dial module as claimed in any one of claims 1-9; a frame board arranged in front of the dial of the dial module; a front glass arranged in front of the frame board; and a casing arranged in the rear of the dial module for fixing the dial module between the frame board and the casing.

In order to attain the above objective, a light-emitting diode (LED) display element defined in claim 16 is a light-emitting diode display element for supplying electric power to a light-emitting element, including a lead terminal for fixing the light-emitting element to an opposite attaching member situated in the same direction as that of emission from the light-emitting element.

In order to attain the above objective, a light-emitting diode display element defined in claim 17 is a light-emitting diode display element including a light-emitting element; an optically transparent member for sealing the light-emitting element, the optically transparent member including a reflecting surface on the side of emission of the light-emitting element and an emitting surface in the rear of the light-emitting element; a reflecting mirror provided on the reflecting surface, for reflecting the emission from the light-emitting element and guiding out the emission from the emitting surface; and a lead terminal connected to the light-emitting element, the lead terminal protruding from a side of the optically transparent member and including an end substantially flush with the emitting surface.

In order to attain the above objective, a meter defined in claim 18 is a meter including: the dial module as claimed in any one of claims 1-9; A first opening formed on a part of the sheet-shaped light source of the dial module; a second opening formed on a part of the flexible printed circuit of the dial module so as to be lined up with the first opening; the light-emitting diode display element according to claim 16 or 17, in which the lead terminal is connected to the flexible printed circuit and the emission from the light-emitting element is guided to the second opening; a design formed on the sheet-shaped dial and illuminated with the emission from the light-emitting element through the first and second openings; a frame board arranged in front of the dial of the dial module; a front glass arranged in front of the frame board; and a casing arranged in the rear of the dial module for fixing the dial module between the frame board and the casing.

In order to attain the above objective, a display module defined in claim 19 is a display module including: a printed board; a display element mounted on the printed board; a driver element mounted on the printed board for driving the display element; and a connecting terminal formed on the printed board.

In order to attain the above objective, a display module defined in claim 20 is, in the invention defined in claim 19, characterized in that the display element is a liquid crystal display element.

In order to attain the above objective, a meter defined in claim 21 is a meter including: the dial module as claimed in any one of claims 1-9; a first notch formed on a part of the sheet-shaped dial of the dial module; a second notch formed on a part of the sheet-shaped light source of the dial module so as to be lined up with the first notch; a display window formed on a part of the flexible printed circuit of the dial module so as to be situated in the rear of the first and second notches; the display module according to claim 19 or 20 mounted on the flexible printed circuit so as to be situated at the display window; a frame board arranged in front of the dial of the dial module; a front glass arranged in front of the frame board; and a casing arranged in the rear of the dial module for fixing the dial module between the frame board and the casing.

In order to attain the above objective, a movement module defined in claim 22 is a movement module including: a printed board; a stepper motor mounted on the printed board; a driver element mounted on the printed board for driving the stepper motor; and a connecting terminal formed on the printed board.

In order to attain the above objective, a meter defined in claim 23 is a meter including: the dial module as claimed in any one of claims 1-9; the movement module according to claim 22 mounted on the flexible printed circuit of the dial module so as to be situated at the display window; a frame board arranged in front of the dial of the dial module; a front glass arranged in front of the frame board; and a casing arranged in the rear of the dial module for fixing the dial module between the frame board and the casing.

In order to attain the above objective, a connector module defined in claim 24 is a connector module including: a housing including first and second tube parts; a first connecting terminal penetrating through a bottom of the first tube part for connecting to an outside connector inside the first tube part, the first connecting terminal being mounted so that a part of the first connecting terminal is situated inside the first tube part while another part of the first connecting terminal is exposed to the outside of the first tube part; a second connecting terminal penetrating through a bottom of the second tube part, the second connecting terminal being mounted so that a part of the second connecting terminal is situated inside the second tube part while another part of the second connecting terminal is exposed to the outside of the second tube part; and a circuit board received in the second tube part, the circuit board being detachably connected to the second connecting terminal.

In order to attain the above objective, a connector module defined in claim 25 is, in the invention defined in claim 24, characterized in that the part of the second connecting terminal, which part is situated inside the second tube part, is a resilient contact.

In order to attain the above objective, a connector module defined in claim 26 is, in the invention defined in claim 24 or 25, characterized in that it further includes a cover for closing an opening of the second tube part.

In order to attain the above objective, a meter defined in claim 27 is a meter including: the dial module as claimed in any one of claims 1-9; the connector module as claimed in any one of claims 24-26, in which each of the other parts of the first and second connecting terminals exposed to the outside of the tube part is connected to the flexible printed circuit of the dial module; a frame board arranged in front of the dial of the dial module; a front glass arranged in front of the frame board; and a casing arranged in the rear of the dial module for fixing the dial module between the frame board and the casing.

BRIEF DESCRIPTION OF THE DRAWINGS

FIG. 2 is an exploded perspective view illustrating a meter for a vehicle, which employs a dial module according to the present invention.

FIG. 3A is a perspective view illustrating a LED display element employed in the meter shown in FIG. 2.

FIG. 3B is a cross sectional view illustrating a LED display element employed in the meter shown in FIG. 2.

FIG. 4 is a partial cross sectional view illustrating a part of a warning display in which the LED display element shown in FIG. 3 is employed.

FIG. 9A is an exploded perspective view illustrating a connector module employed in the meter shown in FIG. 2.

FIG. 9B is a cross sectional view illustrating a connector module employed in the meter shown in FIG. 2.

BEST MODE FOR CARRYING OUT THE INVENTION

In the following, the present invention will be explained with reference to the attached drawings.

Figure 1A:
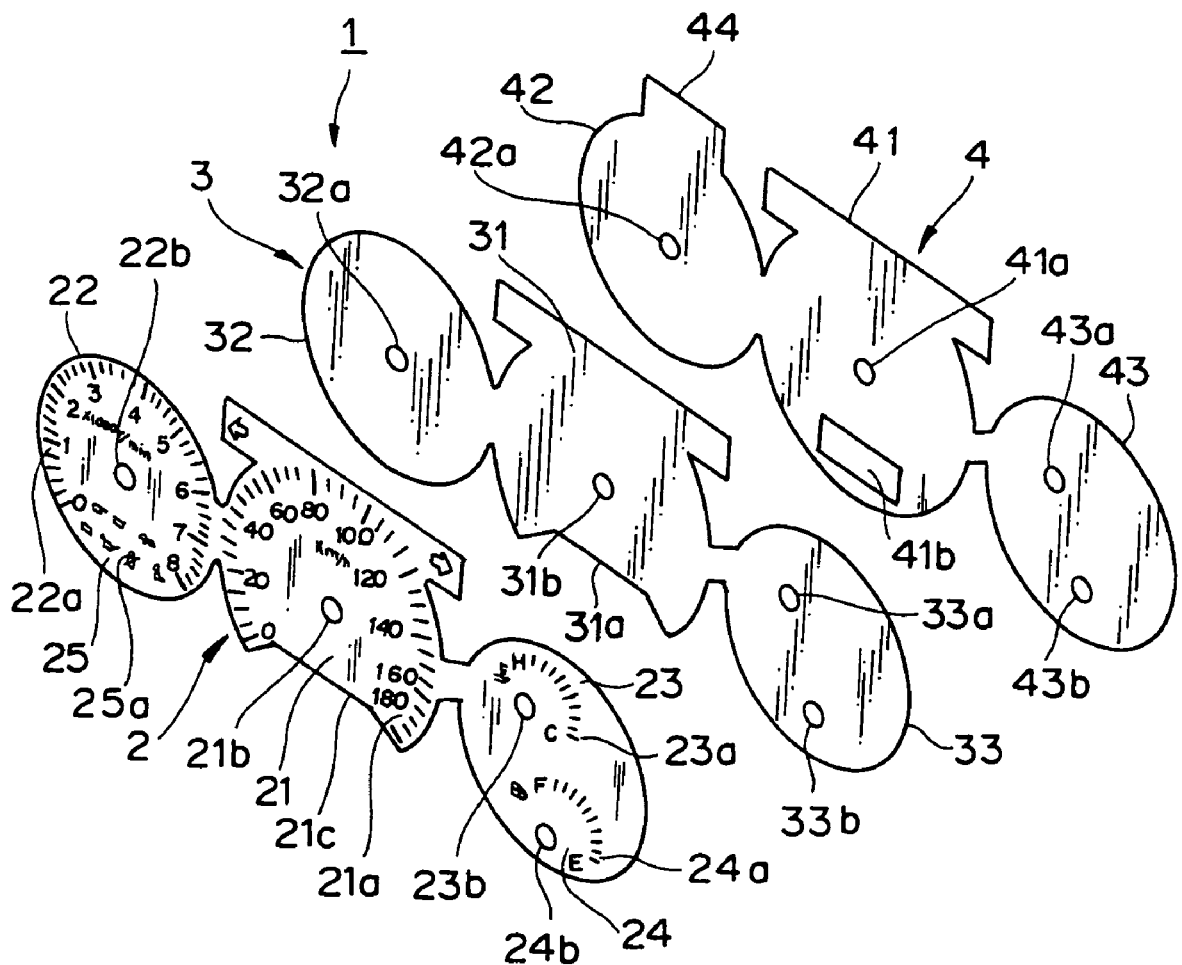
FIG. 1A is an exploded perspective view illustrating a preferred embodiment of a dial module according to the present invention.
Figure 1B:
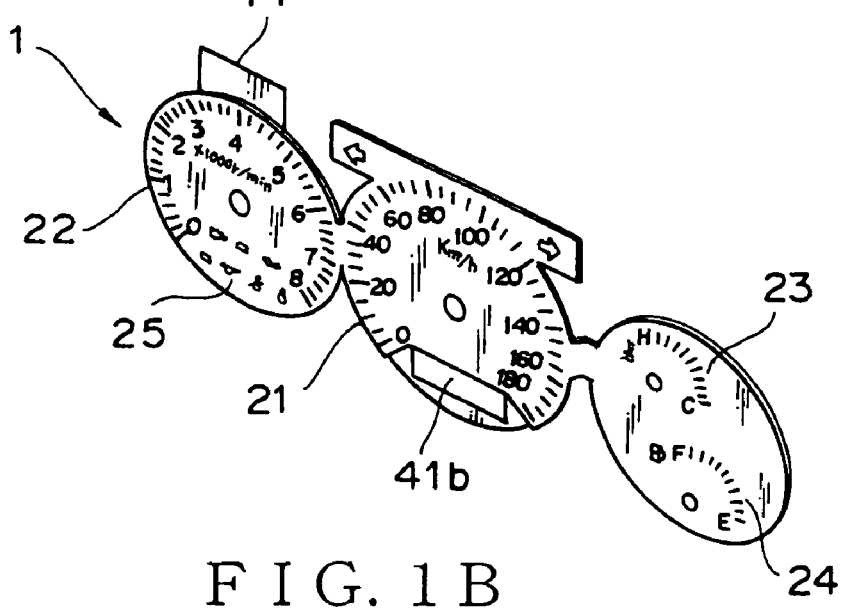
FIG. 1B is a perspective view illustrating a preferred embodiment of an assembled dial module according to the present invention.

FIG. 1A is an exploded perspective view illustrating a preferred embodiment of a dial module according to the present invention. FIG. 1B is a perspective view illustrating a preferred embodiment of an assembled dial module according to the present invention. As shown in FIG. 1A, the dial module (i.e., dial plate module) 1 includes a sheet-shaped dial (i.e., dial plate) 2, electroluminescence light source (hereinafter, EL light source) 3 as a sheet-shaped light source and a flexible printed circuit (hereinafter, FPC) 4.

The dial 2 consisting of, for example, sheet-shaped translucent material, is a sheet-shaped dial, in which a surface of a sheet is provided with meters such as a speed meter 21, tachometer 22, thermometer 23 and fuel meter 24 and various indicators such as a warning display 25. As shown in FIGS.

1A and 1B, for example, in the dial 2, a speed meter 21 is arranged at the center, a circular meter including a thermometer 23 and a fuel meter 24 is connected to one side of the speed meter 21 while another circular meter including a tachometer 22 and a warning display 25 is connected to the opposite side of the speed meter 21.

The speed meter 21 includes: a meter design part 21a consisting of a scale, characters and indices; a through hole 21b formed at the center for guiding a rotation shaft of a stepper motor (explained later on) therethrough; and a notch 21c as a first notch formed at the lower part of the speed meter 21. Similarly, the tachometer 22 includes a meter design part 22a and a through hole 22b, the thermometer 23 includes a meter design part 23a and a through hole 23b, and the fuel meter 24 includes a meter design part 24a and a through hole 24b.

A translucent paint such as a white paint is printed on each of the meter design parts 21a, 22a, 23a, 24a and 25a of the speed meter 21, tachometer 22, thermometer 23, fuel meter 24 and warning display 25, respectively. A light-blocking paint such as a black paint is printed on a portion except each design part.

The EL light source 3 is a sheet-shaped light source formed substantially in the same shape as that of the dial 2. In the EL light source 3, a part 31 corresponding to the speed meter 21, part 32 corresponding to the tachometer 22 and part 33 corresponding to the thermometer 23 and fuel meter 24 are integrally formed with one another in a linked shape. The part 31 includes a through hole 31a formed at the center for guiding a rotation shaft of a stepper motor therethrough and a notch 31a as a second notch formed so as to be lined up with the notch 21c at the lower part of the part 31. Similarly, the part 32 includes a through hole 32a while the part 33 includes through holes 33a and 33b.

Like EL light source 3, the FPC 4 is formed substantially in the same shape as that of the dial 2. In the FPC 4, a part 41 corresponding to the speed meter 21, part 42 corresponding to the tachometer 22 and part 43 corresponding to the thermometer 23 and fuel meter 24 are integrally formed with one another in a linked shape. The part 41 includes a through hole 41a formed at the center for guiding a rotation shaft of a stepper motor therethrough and a display window 41b formed by being notched at the lower part of the part 41. The display window 41b is formed so as to be situated in the rear of the notches 21c and 31a. Similarly, the part 42 includes a through hole 42a while the part 43 includes through holes 43a and 43b.

Further, in the rear of the FPC 4, though they are not shown in the figure, the FPC 4 includes a circuit for carrying out the function of the meters on the dial 2, a circuit for supplying electric power to the EL light source 3, and connecting terminals for connecting electronic components (explained alter on) for carrying out the function of the meters on the dial 2. Further, the FPC 4 includes a connecting terminal 44 for attaching an optional meter, which terminal is formed being extended to the upper part of the part 42.

The EL light source 3 is fixed on the back surface of the dial 2 by fixing means such as an adhesive, while the FPC 4 is fixed on the back surface of the EL light source 3 by fixing means such as an adhesive, thereby the dial 2, EL light source 3 and FPC 4 are integrated and the dial module 1 is completed as shown in FIG. 1B. In the completed dial module 1, the EL light source 3 receives electric power from the circuit of the FPC 4 and illuminates each design part of the dial 2 from the rear.

Thus, in the dial module 1, the dial 2, the EL light source 3 for illuminating each design part of the dial 2, and the FPC 4 having the circuits and connecting terminal for carrying out the function of the meters on the dial 2 and the electric power supply to the EL light source 3 are integrated with one another, so that the dial module 1 is formed in a flexible sheet as a whole. Therefore, the number of components can be reduced so that the assembling work of the meter employing such a dial module can be facilitated, thereby enabling the improvement in productivity and reduce in cost. Since the dial module 1 has a flexible sheet-shaped form, it can be applied not only when all of a plurality of meters constructed by the dial 2 has a flat design but also even when a part of a plurality of meters constructed by the dial 2 has a design including some unevenness, thereby improving in the design.

In the following, a meter employing the dial module of the present invention will be explained with reference to FIGS. 2-6.

FIG. 2 is an exploded perspective view illustrating a meter for a vehicle, which employs the dial module according to the present invention. As shown in FIG. 2, the meter includes a front glass 5, frame board 6, the dial module 1 of the present invention, and casing 7.

On a surface of the FPC 4 situated on the rear side of the dial module 1, there are formed the EL light source 3 and a plurality of connecting terminals (not seen in FIG. 2 because of their positions) for connecting electronic components 8 for carrying out the function of the meters on the dial 2, wherein the EL light source 3 and the electronic components 8 such as a light-emitting diode (i.e., LED) display element 81, display module 82, movement module 83 and connector module 84 are attached to the respective connecting terminals by fixing means such as solder or electrically conductive paste.

As shown in FIGS. 3A and 3B, the LED display element 81 includes a light-emitting element 81a, gold wire 81b, a lead terminal 81c connected to the light-emitting element 81a by the gold wire 81b for supplying electric power to the light-emitting element 81a, and an epoxy resin 81d as a translucent member which is hardened after the light-emitting element 81a is encapsulated therein. The epoxy resin 81d is shaped so that a face facing an attaching direction by the lead terminal 81c becomes a flat emitting surface 81d2 while a face opposite to the attaching direction becomes a curved reflecting surface 81d1, which is subjected to a mirror surface processing by plating or vapor deposition with metallic material such as silver or aluminum so as to form a reflecting mirror.

The lead terminal 81c protrudes from the side of the epoxy resin 81d and is bent toward the emitting surface 81d2. Further, an end 81c1 of the lead terminal 81c is bent so as to be flush with the emitting surface 81d2. The end 81c1 is fixed to a connecting terminal as an opposite attaching member of the FPC 4 by fixing means such as solder or electrically conductive paste. When the end 81c1 is attached to the FPC 4, since the end 81c1 of the lead terminal 81c of the LED display element 81 is flush with the emitting surface 81d2, therefore a space for attaching (i.e., a space for mounting) can be reduced minimizing the space to be the thickness of the end 81c1 itself.

The LED display element 81 constructed as described above is a reflection-type LED display element. As shown by arrows in FIG. 3B, the emission from the light-emitting element 81a is reflected by the reflecting surface 81d1, emitted from the emitting surface 81d2, and forwarded as a parallel ray in the attaching direction to the FPC 4.

FIG. 4 is a partial cross sectional view illustrating a part of the warning display 25, in which the LED display element 81 is employed. As shown in FIG. 4, in the tachometer 22 of the dial 2, the EL light source 3, situated in the rear of a part where the warning display design part 25a is formed in the warning display 25, is provided with an opening 3a as the first opening. The warning display design part 25a is subjected to clear coating. The FPC 4 is provided with an opening 4b as the second opening, which is lined up with the opening 3a. The LED display element 81 is arranged in the rear of the openings 3a and 4b. A lead terminal of the LED display element 81 is attached to a copper foil 4a as the connecting terminal of the FPC 4 by fixing means such as solder or electrically conductive paste. The emission from the LED display element 81 illuminates the warning display design part 25a through the openings 4b and 3a, thereby providing a warning to a driver of a vehicle.

Figure 5:
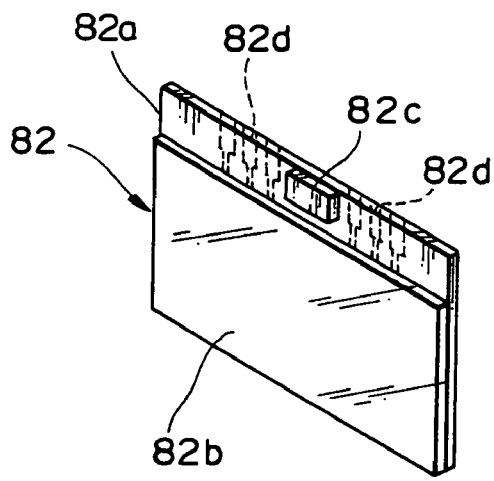
FIG. 5 is a perspective view illustrating a display module employed in the meter shown in FIG. 2.

As shown in FIG. 5, display module 82 includes a printed board 82a, liquid crystal display (LCD) element 82b as the display element mounted on the printed board 82a, driver element 82c consisting of IC or the like for driving the LCD element 82b, and connection terminal 82d formed on the printed board 82a. The LCD element 82b and driver element 82c are connected to each other by a circuit (not shown in the figure) formed on the printed board 82a and also are connected to the connection terminal 82d. The connecting terminal 82d of the display module 82 is attached to the corresponding connecting terminal of the FPC 4 by fixing means such as solder or electrically conductive paste so that the LCD element 82b is situated at the display window 41b formed on the FPC 4.

Thus, since the driver element 82c for driving the LCD element 82b is mounted on the side of the display module 82, therefore the number of components can be reduced. Further, since a space for mounting the driver element 82c becomes unnecessary at the side of the FPC 4, therefore the wiring becomes easy.

Figure 6:
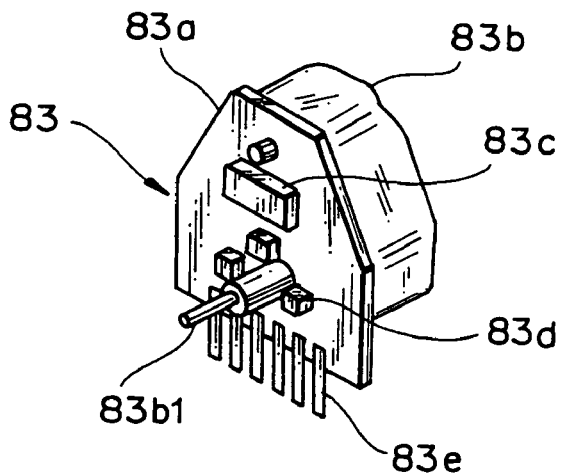
FIG. 6 is a perspective view illustrating a movement module employed in the meter shown in FIG. 2.

As shown in FIG. 6, each movement module 83 includes a printed board 83a, stepper motor 83b as the movement mounted on one surface of the printed board 83a, driver element 83c for driving the stepper motor 83b and LED element 83d, both mounted on the opposite surface of the printed board 83a, and connecting terminal 83e formed at an end of the printed board 83a. A rotation shaft 83b1 of the stepper motor 83b protrudes from the opposite side of the printed board 83a. The connecting terminal 83e is attached to a corresponding connecting terminal of the FPC 4 by fixing means such as solder. When each movement module 83 is fixed to the FPC 4, each rotation shaft 83b1 penetrates through the corresponding through holes 41a, 31b and 21b, through holes 42a, 32a and 22b, through holes 43a, 33a and 23b or through holes 43b, 33b and 24b of the dial module 1 and then, each needle 83f arranged on the front surface-side of the dial module 1 is attached to the corresponding rotation shaft 83b1.

Thus, since the driver element 83c for driving the stepper motor 83b is mounted on the side of the movement module 83, therefore the number of components can be reduced. Further, since a space for mounting the driver element 83c becomes unnecessary at the side of the FPC 4, therefore the wiring becomes easy.

Figure 7:
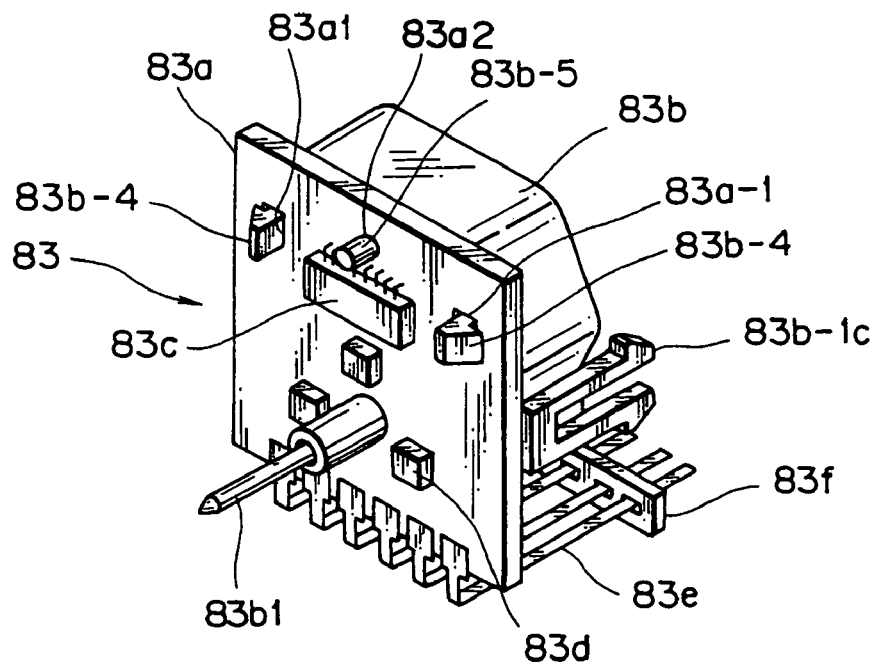
FIG. 7 is a perspective view illustrating another example of a movement module.

FIG. 7 is a perspective view illustrating another example of the movement module 83. As shown in FIG. 7, a positioning pin 83b-5 of the stepper motor 83b is inserted into a positioning hole 83a2 formed in the printed board 83a while a fixing claw 83b-4 of the stepper motor 83b engages with an edge of an attaching hole 83a1 of the printed board 83a, thereby the stepper motor 83b is fixed to the printed board 83a. A connecting terminal 83e formed at an end of the printed board 83a is extended toward the opposite side of the rotation shaft 83b1 and guided by a terminal guide 83f as a separate member. In this example, the movement module 83 can be fixed to an opposite attaching member (not shown in the figure) situated on the opposite side of the rotation shaft 83b1 with a hook 83b-1c while the connecting terminal 83e can be connected to a corresponding connecting terminal (not shown in the figure) on the side of the opposite attaching member.

Figure 8:
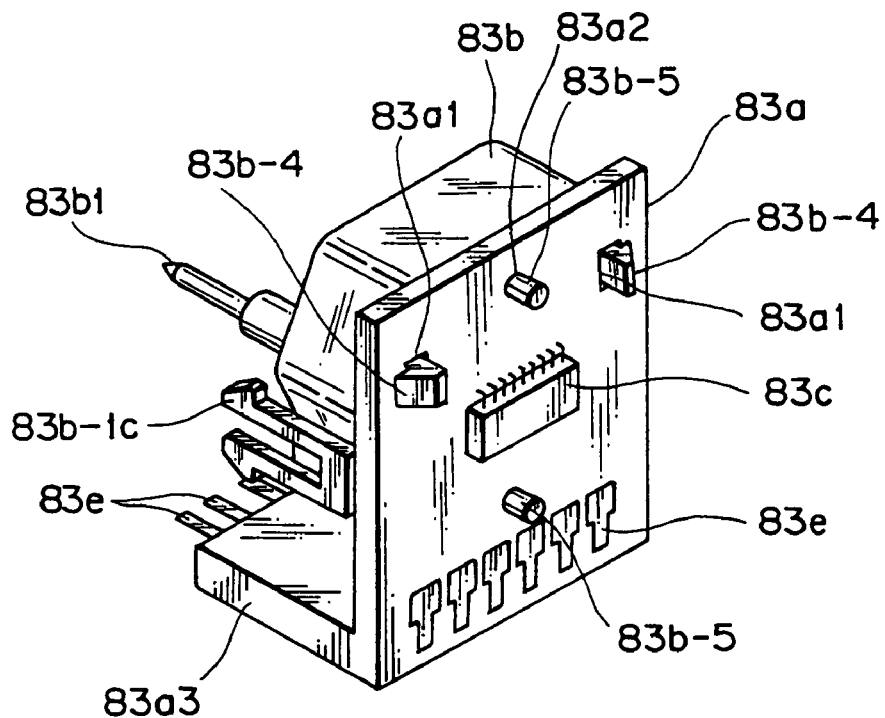
FIG. 8 is a perspective view illustrating a further example of a movement module.

FIG. 8 is a perspective view illustrating a further example of the movement module 83. As shown in FIG. 8, the stepper motor 83b is constructed so that its rotation shaft 83b1 extends in the same direction as that of the hook 83b-1c. Further, a terminal guide 83a3 is integrally formed extending from an end of the printed board 83a. The connecting terminal 83e penetrates through the terminal guide 83a3 and is exposed to the same side as that of the rotation shaft 83b1. A positioning pin 83b-5 of the stepper motor 83b is inserted into a positioning hole 83a2 formed in the printed board 83a while a fixing claw 83b-4 of the stepper motor 83b engages with an edge of an attaching hole 83a1 of the printed board 83a, thereby the stepper motor 83b is fixed to the printed board 83a. In this example, the movement module 83 can be fixed to an opposite attaching member (not shown in the figure) situated on the same side as that of the rotation shaft 83b1 with a hook 83b-1c while the connecting terminal 83e can be connected to a corresponding connecting terminal (not shown in the figure) on the side of the opposite attaching member.

As shown in FIGS. 9A and 9B, the connector module 84 includes: a housing 84a having a tube part 84b as the first tube part and a tube part 84c as the second tube part; a cover 84f for closing an opening of the tube part 84c; a connecting terminal 84d as the first connecting terminal; and a connecting terminal 84e as the second connecting terminal. The connecting terminal 84d is attached so that the connecting terminal 84d penetrates through the bottom of the tube part 84b and a part thereof is situated in the tube part 84b while another part is exposed to the outside of the tube part 84b. The connecting terminal 84e is attached so that the connecting terminal 84e penetrates through the bottom of the tube part 84c and a part thereof is situated in the tube part 84c while another part is exposed to the outside of the tube part 84c. The part of the connecting terminal 84e situated in the tube part 84c is a resilient contact part. Each of the other parts of the connecting terminals 84d and 84e exposed to the outside of the housing 84a is attached to the corresponding connecting terminal of the FPC 4 by fixing means such as solder or the like. After the connector module 84 is mounted to the FPC 4, a wiring harness connector 84g as an external connector is connected to the connecting terminals 84d, while a control circuit board 84h replaceable depending on a type of a vehicle is detachably connected to the resilient contact part of the connecting terminal 84e in a slot-in manner. The control circuit board 84h is a circuit board on which electronic components for constructing a meter control circuit that is varied depending on a type of a vehicle are mounted.

Thus, since the control circuit board 84h is mounted on the side of the connector module 84, therefore the number of components can be reduced. Even when the design of the meter is changed depending on a type of a vehicle, one can respond to it only by replacing the control circuit board 84h, that is, one can use the connector module usable in common for every type of a vehicle not being affected by a shape of the meter. Further, even when the shape of the connector is different, a common product can be used if the shape of the tube part 84c is matched. Furthermore, when the specification of the meter control circuit is changed, this change is easily carried out only by replacing the control circuit board 84h with that of a different specification. For example, when the specification of an engine is changed, when the specification of a tire is changed, and when the capacity of a gasoline tank is changed, the specification can be easily changed only by replacing the control circuit board 84*h*.

In addition, as for the FPC 4, a space for mounting the electronic components corresponding to the control circuit board 84*h* becomes unnecessary, therefore the wiring becomes simple since it can be carried out only by mounting the electronic components common to every type of a vehicle. Since there is the resilient contact part of the connecting terminal 84*e* to be connected to the control circuit board 84*h*, it is easy to attach or detach the control circuit board 84*h*. Since the opening of the tube part 84*c* is closed by the cover 84*f*, the control circuit board 84*h* is prevented from coming off and from being affected by dust.

The casing 7 includes recesses 7*a* matching with the shape of the dial module 1 and recesses 7*b* matching with the unevenness of the electronic components 8 to be mounted on the FPC 4. The casing 7 fixes the dial module 1, in which the electronic components 8 are mounted on the FPC 4, between the frame board 6 and the casing 7.

As for the meter constructed as described above, since the dial module 1 is employed therein, the number of components can be reduced so that the assembling work of the meter can be facilitated, thereby enabling the improvement in productivity and reduce in cost. Further, it enables to minimize the restriction for designing, to reduce the man-hour for designing a board, and to reduce the number of evaluation as to noise or the like.

Since the dial module 1 is provided with the connection terminal 44 for attaching an additional component thereto, such a connection terminal 44 can be used when the additional circuit is necessary or when an optional meter such as an accelerometer or the like is connected thereto depending on a type of a vehicle. For example, when an optional meter is connected thereto, such an optional meter can be attached thereto by inserting a connector (not shown in the figure) of the optional meter from a direction parallel to the plane of the dial 2. At that time, since the insertion direction is not perpendicular to the plane of the dial 2 but parallel to the plane, the sheet-shaped dial module 1 is prevented from being applied by an extra load and therefore prevented from being broken, and a space for mounting an additional component can be reduced.

The aforementioned preferred embodiments are described to aid in understanding the present invention and variations may be made by one skilled in the art without departing from the spirit and scope of the present invention.

For example, in the preferred embodiment described above, the dial module 1 is constructed by forming the dial 2, EL light source 3 and FPC 4, which are originally separate from one another, integrally with one another by fixing means such as an adhesive or the like. However, instead, as another preferred embodiment, the dial module may be constructed in such a manner that a front surface of the sheet-shaped EL light source 3 is provided with a dial having a meter design part by printing or the like and the FPC 4 is fixed to a back surface of the EL light source 3 by fixing means such as an adhesive or the like. In such a case, the FPC 4 and EL light source 3 can be formed in substantially the same shape.

In the following, a process for manufacturing the dial module according to the other preferred embodiment as described above will be explained. In short, in this process, first the EL light source 3 is made and afterward, the FPC 4 is made separately. Then, the FPC 4 is affixed and sealed on a back surface of the EL light source 3 with an adhesive. Then, the dial 2 is printed on a front surface of the EL light source 3, thereby completing the manufacture of the dial module 1.

In the following, the process described above will be explained in detail with reference to FIG. 10.

First, the EL light source 3 is made as follows:

(A) A transparent electrically conductive film, in which a transparent electrode 302 is formed on a transparent base film 301, is prepared.

(B) Then, a fluorescent agent is printed on the transparent electrode 302 so as to form a fluorescent layer 303 there.

(C) Then, an electrically insulating layer 304 is formed on the light-emitting layer 303 by printing.

(D) Then, a back surface electrode 305 is formed on the electrically insulating layer 304 by printing, thereby the EL light source 3 is made.

Then, the FPC 4 is made separately as follows:

(E) A copper foil film, in which a copper foil 402 is placed on a base film 401, is prepared.

(F) Then, the copper foil 402 is subjected to etching so as to make a circuit.

(G) Then, an electrically insulating layer 403 is formed on the circuit by printing.

Then, the EL light source 3 and the FPC 4 made separately are employed so as to complete the manufacture of the dial module 1 as follows:

(H) The FPC 4 is affixed and sealed on a back surface of the EL light source 3 with an adhesive.

(I) Then, a dial 2 is printed on a front surface of the EL light source 3, thereby completing the manufacture of the dial module 1.

Figure 11:
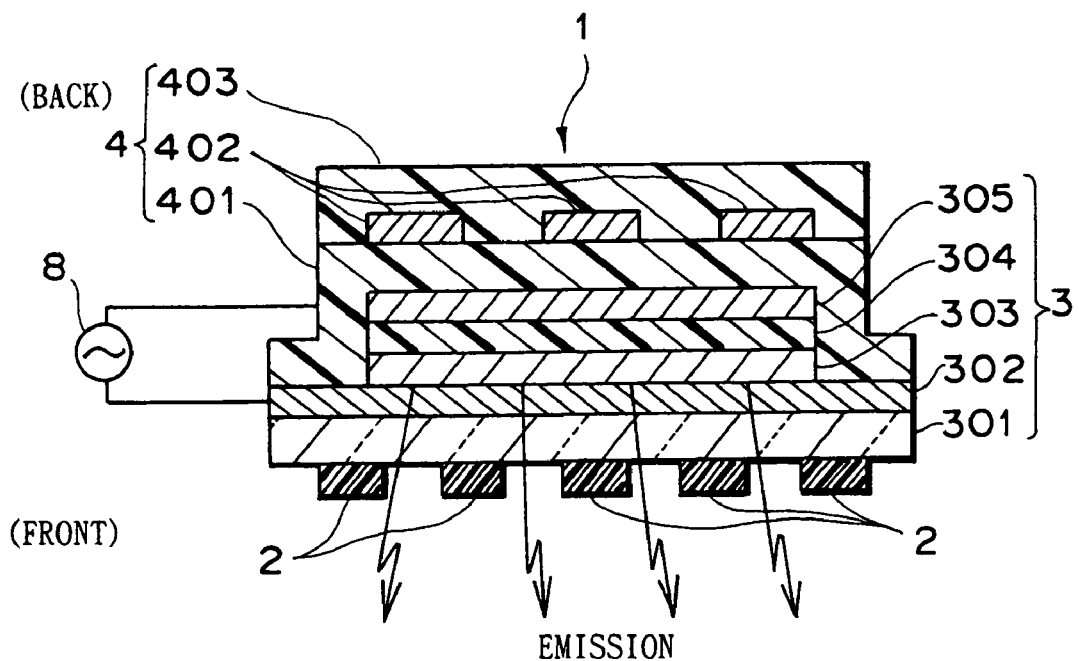
FIG. 11 is a view illustrating an action of a dial module according to another preferred embodiment of the present invention.
Figure 10A:
FIGS. 10A-10I illustrate each step of a process for manufacturing a dial module according to another preferred embodiment of the present invention.
Figure 10B:
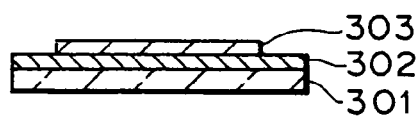
Figure 10E:
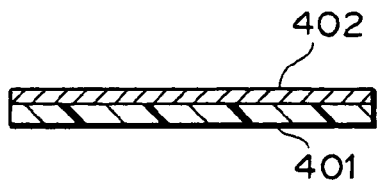
Figure 10C:
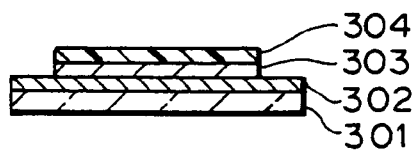
Figure 10F:
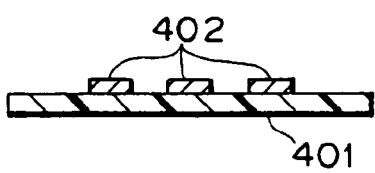
Figure 10D:
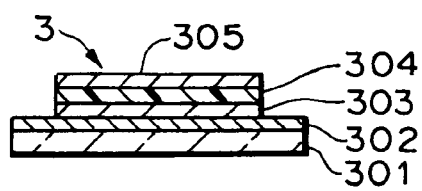
Figure 10G:
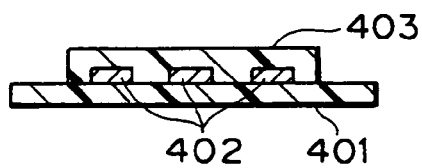
Figure 10H:
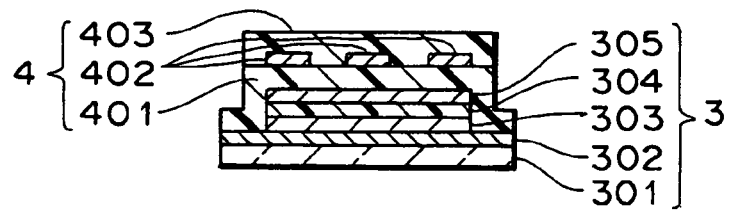
Figure 10I:
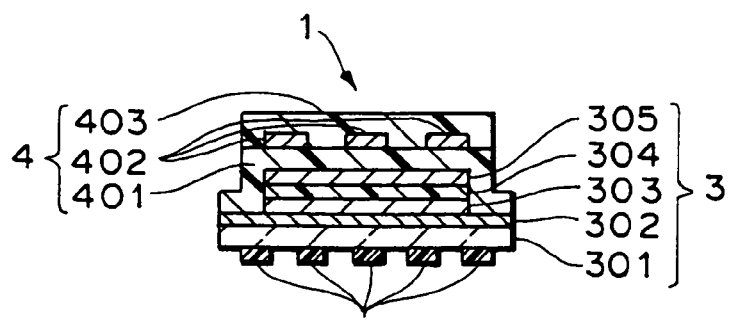

As shown in FIG. 11, as for the dial module 1 thus manufactured, an alternating voltage is applied from an alternating-current source to between the transparent electrode 302 and the back surface electrode 305, thereby the light-emitting layer 303 emits the light so that the dial 2 formed on the front surface-side can be illuminated from the back surface-side.

Thus, as for the dial module 1 according to the other preferred embodiment as described above, the EL light source 3 on which the dial 2 is applied and the FPC 4 are formed in one piece, thereby the module 1 is constructed as a flexible sheet as a whole. Therefore, the number of components can be reduced so that the assembling work of the meter employing such a dial module can be facilitated, thereby enabling the improvement in productivity and reduce in cost.

As a further preferred embodiment of the present invention, the dial module may be constructed in such a manner that a dial having meter design parts is formed on a front surface of a sheet-shaped EL light source 3 by printing and a FPC 4 is formed on a back surface of the EL light source 3 by printing.

Figures 12A, 12B, 12C, 12D:
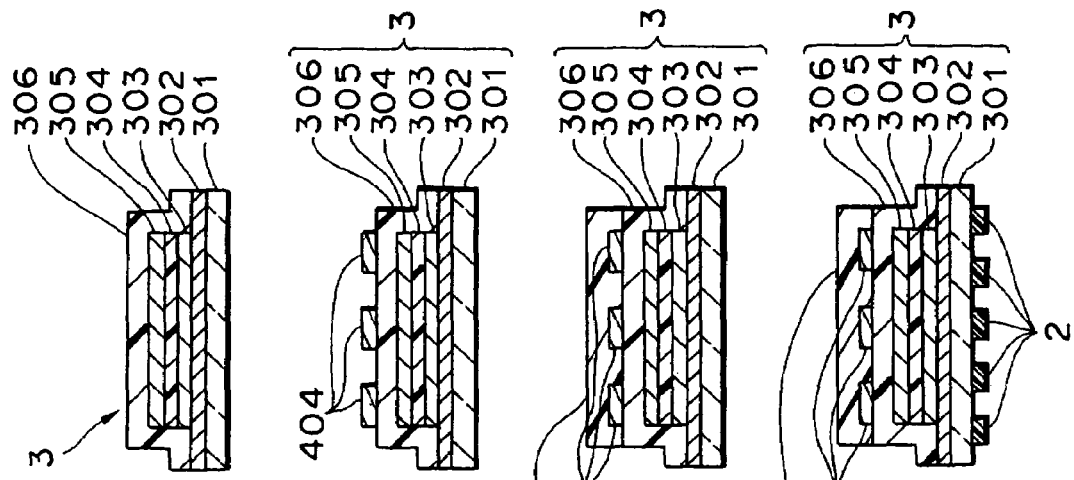
FIGS. 12A-12D illustrate each step of a process for manufacturing a dial module according to a further preferred embodiment of the present invention.
Figure 14:
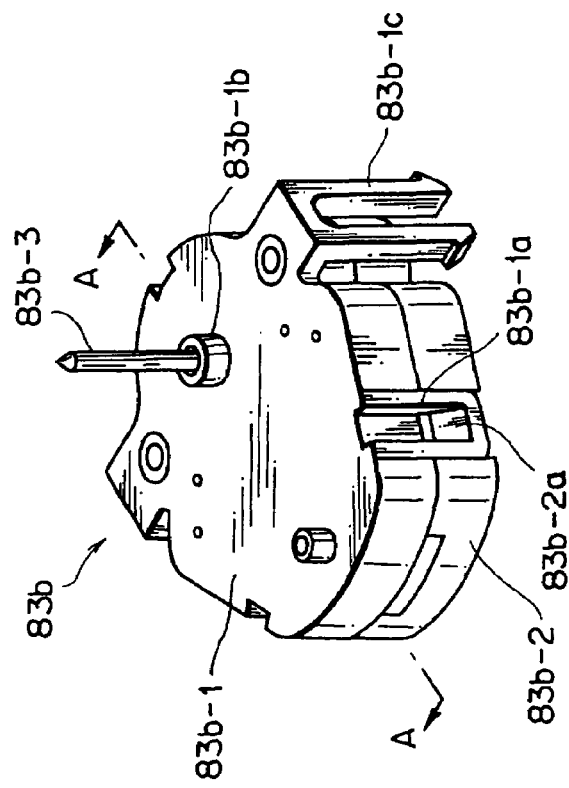
FIG. 14 is a perspective view of a stepper motor used in the meter for a vehicle shown in FIG. 13.
Figure 13:
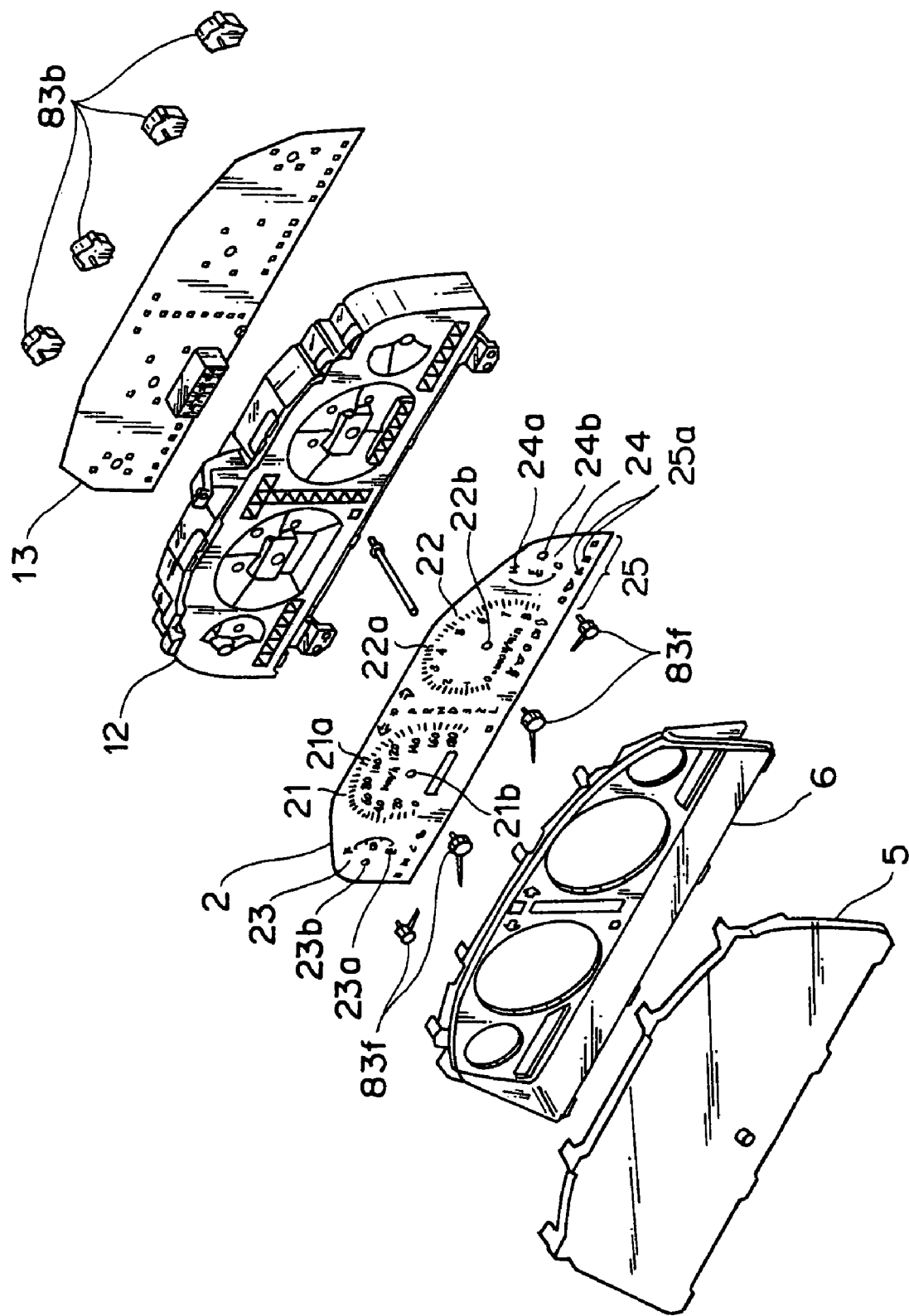
FIG. 13 is an exploded perspective view illustrating an example of a conventional meter for a vehicle.
Figure 15:
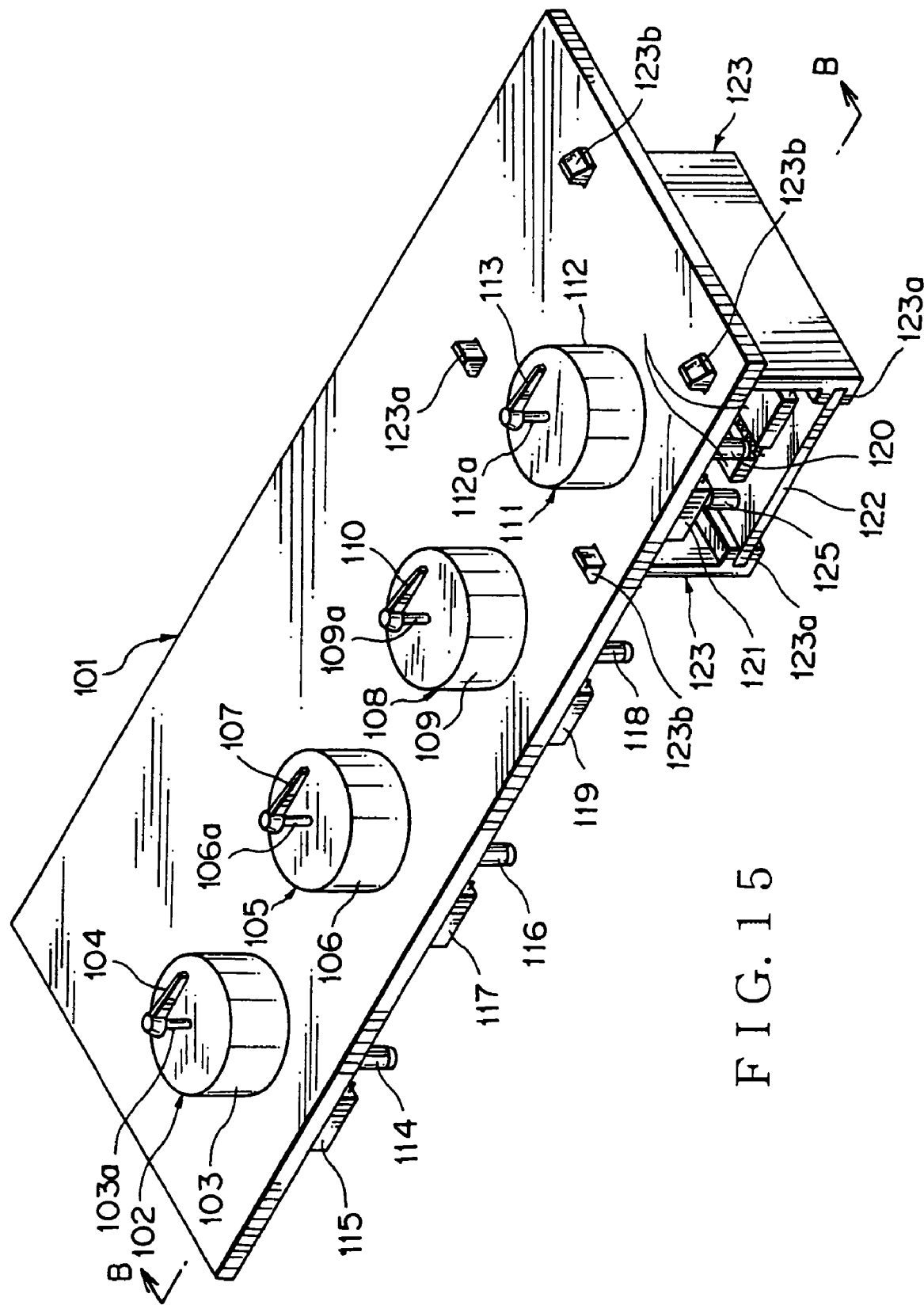
FIG. 15 is a perspective view illustrating another example of a conventional meter for a vehicle.
Figure 16:
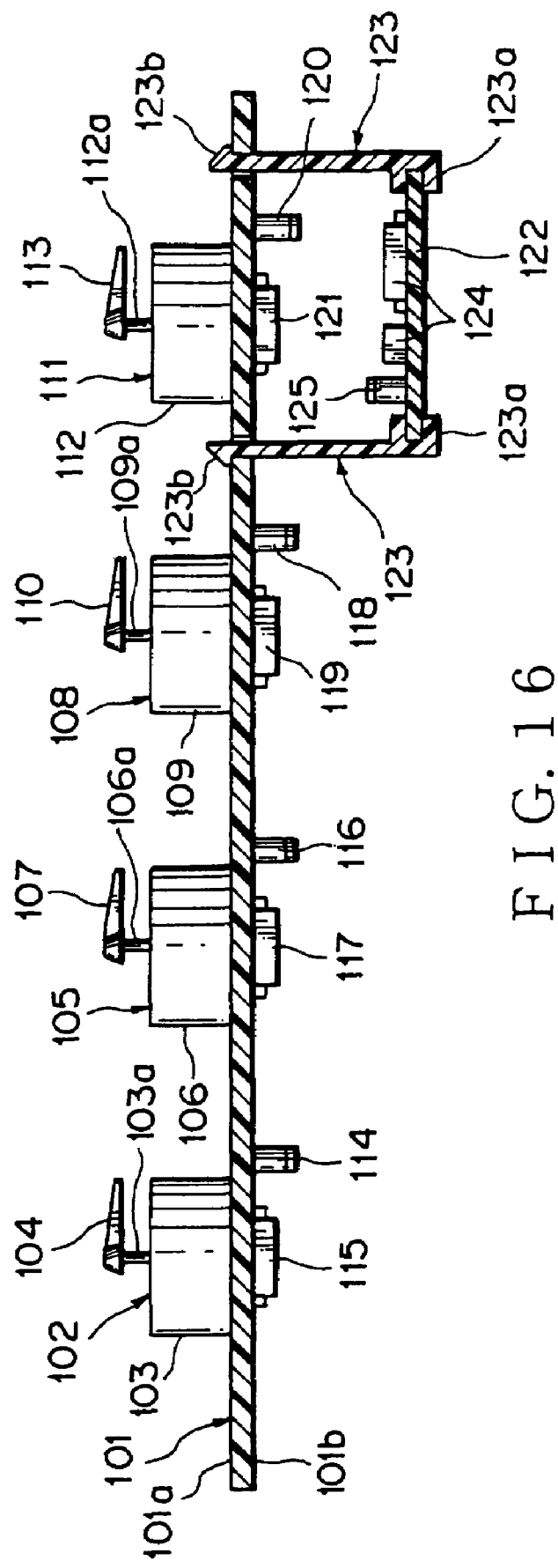
FIG. 16 is a cross sectional view taken along B-B line of the meter for a vehicle shown in FIG. 15.

In the following, a process for manufacturing the dial module according to the further preferred embodiment described above will be explained with reference to FIG. 12.

(A) First, a sheet-shaped EL light source 3 consisting of a transparent base film 301, transparent electrode 302, light-emitting layer 303, electrically insulating layer 304, back surface electrode 305 and protection layer 306 is prepared.

(B) Then, an electrically conductive material 404 is printed on the protection layer 306 formed on a back surface of the EL light source 3 so as to form a circuit.

(C) Then, according to a need, an electrically insulating layer 405 is formed on the circuit consisting of the electrically conductive material 404 by printing. Thereby, the back surface-side of the sheet-shaped EL light source 3 has the same function as that of the FPC 4 with the aid of the circuit consisting of the electrically conductive material 404.

(D) Then, a dial 2 is formed on the base film 301 situated on a front surface of the EL light source 3 by printing, thereby completing the manufacture of the dial module 1.

As for the dial module 1 thus manufactured, an alternating voltage is applied to between the transparent electrode 302 and the back surface electrode 305, thereby the light-emitting layer 303 emits the light so that the dial 2 formed on the front surface-side can be illuminated from the back surface-side.

Thus, as for the dial module 1 according to the further preferred embodiment as described above, the dial 2 is formed on the surface-side and the FPC 4 is formed on the back surface-side, thereby the module 1 is constructed as a flexible sheet as a whole. Therefore, the number of components can be further reduced so that the assembling work of the meter employing such a dial module can be facilitated, thereby enabling the improvement in productivity and reduce in cost.

Furthermore, as a further preferred embodiment of the present invention, the dial module may be constructed in such a manner that a sheet-shaped EL light source 3 having a FPC 4 on the back surface thereof is fixed to a back surface of a sheet-shaped dial 2 having meter design parts on a surface thereof by fixing means such as an adhesive so that the emission from the EL light source 3 illuminates the meter design parts of the dial 2. In this case, the dial 2 and the EL light source 3 can be formed in substantially the same shape.

Thus, as for the dial module 1 according to the further preferred embodiment as described above, the sheet-shaped dial 2 and the sheet-shaped EL light source 3 having the FPC 4 on the back surface thereof are formed in one piece, thereby the module 1 is constructed as a flexible sheet as a whole. Therefore, the number of components can be reduced so that the assembling work of the meter employing such a dial module can be facilitated, thereby enabling the improvement in productivity and reduce in cost and enabling to meet with the demand of a plurality of types of vehicle in common.

As for the EL light source 3 in the present invention, either of organic and inorganic EL light sources can be employed.

INDUSTRIAL APPLICABILITY

With the invention defined in claim 1, the number of components can be reduced so that the assembling work of the meter employing such a dial module can be facilitated, thereby enabling the improvement in productivity and reduce in cost. Since the dial module has a flexible sheet-shaped form, it can be applied not only when all of a plurality of meters constructed by the dial has a flat design but also even when a part of a plurality of meters constructed by the dial has a design including some unevenness, thereby improving in the design and enabling to meet with the demand of a plurality of types of vehicle in common.

With the invention defined in claim 2, the manufacturing can be easy.

With the invention defined in claim 3, the number of components can be further reduced so that the assembling work of the meter employing such a dial module can be facilitated, thereby enabling the improvement in productivity and reduce in cost. It is possible to meet with the demand of a plurality of types of vehicle in common.

With the invention defined in claim 4, the manufacturing can be easy.

With the invention defined in claim 5, the number of components can be further reduced so that the assembling work of the meter employing such a dial module can be facilitated, thereby enabling the improvement in productivity and reduce in cost. It is possible to meet with the demand of a plurality of types of vehicle in common.

With the invention defined in claim 6, the manufacturing can be easy.

With the invention defined in claim 7, the number of components can be further reduced so that the assembling work of the meter employing such a dial module can be facilitated, thereby enabling the improvement in productivity and reduce in cost. It is possible to meet with the demand of a plurality of types of vehicle in common.

With the invention defined in claim 8, it is possible to meet with a case when an additional circuit is needed depending on a type of a vehicle or a case when an optional meter such as accelerometer or the like is connected thereto.

With the invention defined in claim 9, the dial module can be realized by employing a sheet-shaped electroluminescent light source as the sheet-shaped light source.

With the invention defined in claim 10, it is possible to easily manufacture the dial module, with which the sheet-shaped light source having the dial and the flexible printed circuit for carrying out the function of the dial are integrally formed.

With the invention defined in claim 11, it is possible to manufacture the sheet-shaped light source and the flexible printed circuit, which are the components of the dial module.

With the invention defined in claim 12, it is possible to easily manufacture the dial module including the dial and the sheet-shaped light source having the function of the flexible printed circuit for carrying out the function of the dial.

With the invention defined in claim 13, it is possible to easily manufacture the dial module, in which an insulation processing is applied on a part where the circuit is formed as the need arises.

With the invention defined in claim 14, the dial module can be realized by employing a sheet-shaped electroluminescent light source as the sheet-shaped light source.

With the invention defined in claim 15, the number of components can be reduced so that the assembling work of the meter can be facilitated, thereby enabling the improvement in productivity and reduce in cost. It is possible to meet with the demand of a plurality of types of vehicle in common.

With the invention defined in claim 16, a space for attaching the light-emitting diode can be reduced.

With the invention defined in claim 17, a space for attaching the light-emitting diode can be reduced since the space can be set to be only its thickness due to the construction of the reflection-type light-emitting diode.

With the invention defined in claim 18, the number of components can be reduced so that the assembling work of the meter can be facilitated, thereby enabling the improvement in productivity and reduce in cost. It is possible to meet with the demand of a plurality of types of vehicle in common.

With the invention defined in claim 19, the number of components can be reduced so that the assembling work of the meter employing such a display module can be facilitated, thereby enabling the improvement in productivity and reduce in cost. It is possible to meet with the demand of a plurality of types of vehicle in common.

With the invention defined in claim 20, the display module can be realized by employing a liquid crystal display.

With the invention defined in claim 21, the number of components can be reduced so that the assembling work of the meter can be facilitated, thereby enabling the improvement in productivity and reduce in cost. It is possible to meet with the demand of a plurality of types of vehicle in common.

With the invention defined in claim 22, the number of components can be reduced so that the assembling work of the meter employing such a movement module can be facilitated, thereby enabling the improvement in productivity and reduce in cost. It is possible to meet with the demand of a plurality of types of vehicle in common.

With the invention defined in claim 23, the number of components can be reduced so that the assembling work of the meter can be facilitated, thereby enabling the improvement in productivity and reduce in cost. It is possible to meet with the demand of a plurality of types of vehicle in common.

With the invention defined in claim 24, the number of components can be reduced so that the assembling work of the meter employing such a movement module can be facilitated, thereby enabling the improvement in productivity and reduce in cost. It is possible to meet with the demand of a plurality of types of vehicle in common. Further, it is possible to meet easily a change in the specification.

With the invention defined in claim 25, it is easy to attach or detach the circuit board.

With the invention defined in claim 26, it is possible to prevent the circuit board from coming off and to prevent dust from entering thereinto.

With the invention defined in claim 27, the number of components can be reduced so that the assembling work of the meter can be facilitated, thereby enabling the improvement in productivity and reduce in cost. It is possible to meet with the demand of a plurality of types of vehicle in common.

What is claimed is:

1. A connector module comprising:
   an outside wiring harness connector;
   a circuit board;
   a housing including a first tube part configured for receiving the outside wiring harness connector and a second tube part configured for receiving the circuit board;
   a first connecting terminal penetrating through a bottom of the first tube part, the first connecting terminal being mounted so that a part of the first connecting terminal is situated inside the first tube part for detachably connecting to the outside wiring harness connector, while another part of the first connecting terminal is exposed to the outside of the first tube part;
   a second connecting terminal penetrating through a bottom of the second tube part, the second connecting terminal being mounted so that a part of the second connecting terminal is situated inside the second tube part for directly contacting the circuit board, while another part of the second connecting terminal is exposed to the outside of the second tube part, the circuit board being detachably connected to the second connecting terminal.

2. The connector module according to claim 1, wherein the part of the second connecting terminal, which part is situated inside the second tube part, is a resilient contact.

3. The connector module according to claim 1 further comprising a cover for closing an opening of the second tube part.

4. A meter comprising:
   a dial module including a sheet-shaped dial having a design part on a front surface of the dial, a sheet-shaped light source fixed to a back surface of the dial for illuminating the design part, and a flexible printed circuit fixed to a back surface of the light source,
   a connector module having,
   a housing including first and second tube parts;
   a first connecting terminal penetrating through a bottom of the first tube part for connecting to the outside connector inside the first tube part, the first connecting terminal being mounted so that a part of the first connecting terminal is situated inside the first tube part while another part of the first connecting terminal is exposed to the outside of the first tube part;
   a second connecting terminal penetrating through a bottom of the second tube part, the second connecting terminal being mounted so that a part of the second connecting terminal is situated inside the second tube part for directly contacting a circuit board, while another part of the second connecting terminal is exposed to the outside of the second tube part;
   a circuit board received in the second tube part, the circuit board being detachably connected to the second connecting terminal, in which each of the other parts of the first and second connecting terminals exposed to the outside of the tube part is connected to the flexible printed circuit of the dial module;
   a frame board arranged in front of the dial of the dial module;
   a front glass arranged in front of the frame board; and
   a casing arranged in the rear of the dial module for fixing the dial module between the frame board and the casing.

* * * * *